United States Patent [19]
Matsuo

[11] Patent Number: 4,790,895
[45] Date of Patent: Dec. 13, 1988

[54] LAMINATER

[75] Inventor: Takao Matsuo, Kobe, Japan

[73] Assignee: Somar Corporation, Tokyo, Japan

[21] Appl. No.: 26,847

[22] PCT Filed: Jun. 6, 1986

[86] PCT No.: PCT/JP86/00283
§ 371 Date: Feb. 6, 1987
§ 102(e) Date: Feb. 6, 1987

[87] PCT Pub. No.: WO86/07301
PCT Pub. Date: Dec. 18, 1986

[30] Foreign Application Priority Data
Jun. 7, 1985 [JP] Japan ................................ 60-122640

[51] Int. Cl.$^4$ .............................................. B32B 31/18
[52] U.S. Cl. ................................... 156/353; 156/354; 156/355; 156/513; 156/516; 156/517; 156/521; 156/529; 156/555.

[58] Field of Search ................ 156/516, 517, 521, 522, 156/555, 513, 514, 518, 529, 530, 267, 497, 353, 354, 355, 356

[56] References Cited
U.S. PATENT DOCUMENTS
4,585,509 4/1986 Obayashi .............................. 156/517
4,659,419 4/1987 Miyake ................................ 156/522
4,680,079 7/1987 Tanaka ................................ 156/522

Primary Examiner—Caleb Weston
Attorney, Agent, or Firm—Stephen F. K. Yee

[57] ABSTRACT

A laminater for laminating a film cut to a predetermined length onto a substrate with positioning holes has a punching device for forming alignment holes in the film which correspond to the positioning holes in the substrate. The punching device is disposed adjacent to the path along which the film in continuous form is supplied to the substrate. The punching device is equipped with an apparatus for directing a gaseous fluid against the film to remove chips of the film resulting from the punching operation.

5 Claims, 3 Drawing Sheets

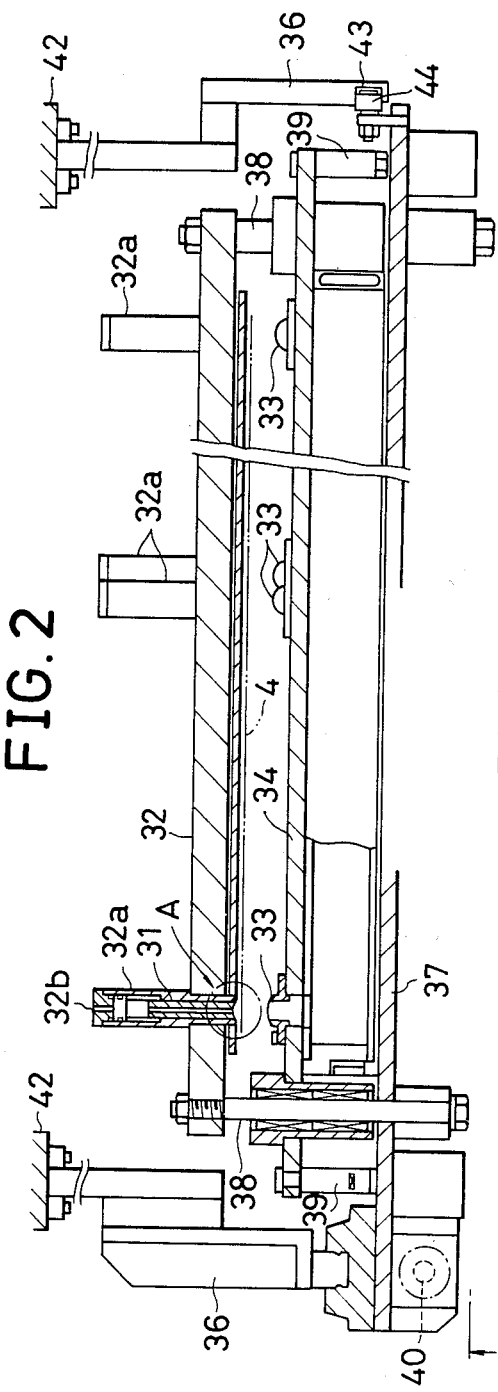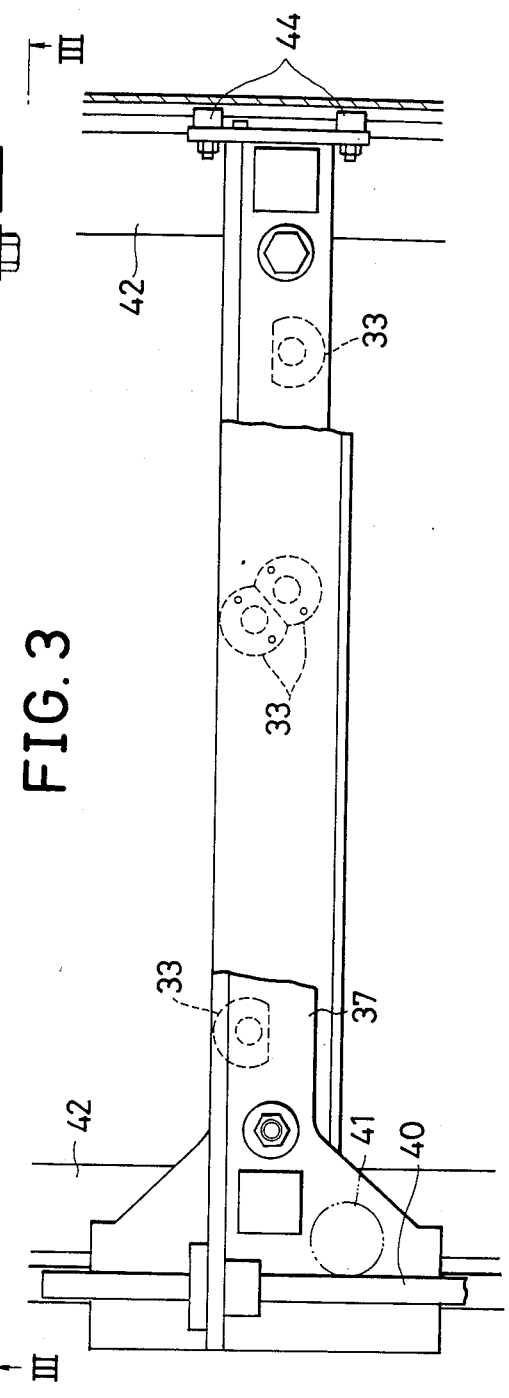

LAMINATER

TECHNICAL FIELD

The present invention relates to a punching device and, more particularly, to a technique effective for application to a film punching device for use with a laminater.

BACKGROUND ART

Printed-wiring boards to be used for electronic equipment such as computers are prepared by forming a determined pattern of wiring of copper or the like on one or both sides of an insulating substrate.

Printed-wiring boards of this kind may be prepared by the following manufacturing steps.

First, a laminated film consisting of a photosensitive resin (photoresist) layer and a translucent resin film (protective layer) protecting the photosensitive resin layer is laminated by thermocompression bonding on a conductive layer mounted on an insulating substrate. The lamination by thermocompression bonding may be conducted on a large scale using a film laminating apparatus or a so-called laminater. Thereafter, a wiring pattern film is superposed on the laminated film, and the photosensitive resin layer is exposed for a determined period of time through the wiring pattern film and the translucent resin film. After the translucent resin film is peeled off using a peeling device, the exposed photosensitive resin layer is developed to form an etching mask pattern. Thereafter, unnecessary portions of the conductive layer are removed by etching and further the remaining photosensitive resin layer is removed, thereby producing a printed-wiring board with a predetermined wiring pattern.

In the manufacturing steps of the printed-wiring boards as described above, it is necessary during the step of exposing the photosensitive resin layer to superpose the wiring pattern film on the laminated film laminated on the substrate by thermocompression bonding. This superposition is carried out by fitting a positioning pin in a guide hole (or a positioning hole) formed at a corner or end portion of the substrate and a guide hole (or a positioning hole) formed on the wiring pattern film so as to correspond to the above guide hole. Since the laminated film is laminated on the substrate, a hole for fitting the positioning pin is formed on the laminated film by punching at the position corresponding to the guide hole on the substrate prior to the fitting of the positioning pin. The punching of the laminated film may be effected manually using a drill or a punch or mechanically using a punching device for exclusive use after the laminated film has been laminated on the substrate by thermocompression bonding.

However, manual or mechanical punching of the laminated film causes problems, resulting in extremely poor work efficiency.

In forming a hole by punching the laminated film, chips of the laminated film are scattered on the laminated film on which a wiring pattern is formed and it is extremely hard to clear such chips. This prevents the wiring pattern from being drawn accurately on the photosensitive resin layer, resulting in decreased yield in the manufacture of printed-wiring boards.

DISCLOSURE OF THE INVENTION

The object of the present invention is to provide a laminater capable of improving work efficiency.

Other objects of the present invention are to provide a laminater capable of improving manufacturing yield, in addition to achieving the above object.

The present invention is characterized in that, in a laminater for laminating a film, which is cut to a predetermined length, on a substrate with positioning holes, a punching device for forming through-holes of predetermined sizes on the film at positions corresponding to the positioning holes of the substrate is disposed at a predetermined position on a film feeding passage along which the film is fed from a film feeding apparatus to the substrate. With this arrangement, the present invention can form through holes at the through-hole positions on the film corresponding to the positions of the positioning holes on the substrate prior to or during lamination of the film on the substrate so that work efficiency can be improved.

The present invention is also characterized in that, in a laminater for laminating a film, which is cut to a predetermined length, on a substrate with positioning holes, a punching device for forming through-holes of predetermined sizes on the film at positions corresponding to the positioning holes of the substrate is disposed at a predetermined position on a film feeding passage along which the film is fed from a film feeding apparatus to the substrate and a device is provided for removing chips of the film produced as the film is punched with the punching device. With this arrangement, the present invention can improve work efficiency because the through-holes can be formed at the through-hole positions of the film corresponding to the positioning holes of the substrate prior to or during the lamination of the film on the substrate, as well as improve manufacturing yield because the through-holes are formed at the through-hole positions prior to or during the lamination of the film on the substrate and the chips of the film can be removed at this moment.

BRIEF DESCRIPTION OF THE DRAWINGS

FIGS. 2 to 5 are each a view illustrating the detail of the punching device in FIG. 1, in which:

FIG. 2 is a sectional view illustrating the punching device cut with a plane perpendicular to the film surface;

FIG. 3 is a side view illustrating the punching device, taken in the direction of the line III—III in FIG. 2;

FIG. 4 is an enlarged sectional view illustrating the portion A in FIG. 2; and

FIG. 5 is an enlarged bottom view illustrating the portion A in FIG. 2.

BEST MODE FOR CARRYING OUT THE INVENTION

The embodiments of the present invention will be described with reference to the drawings.

Figure 1:
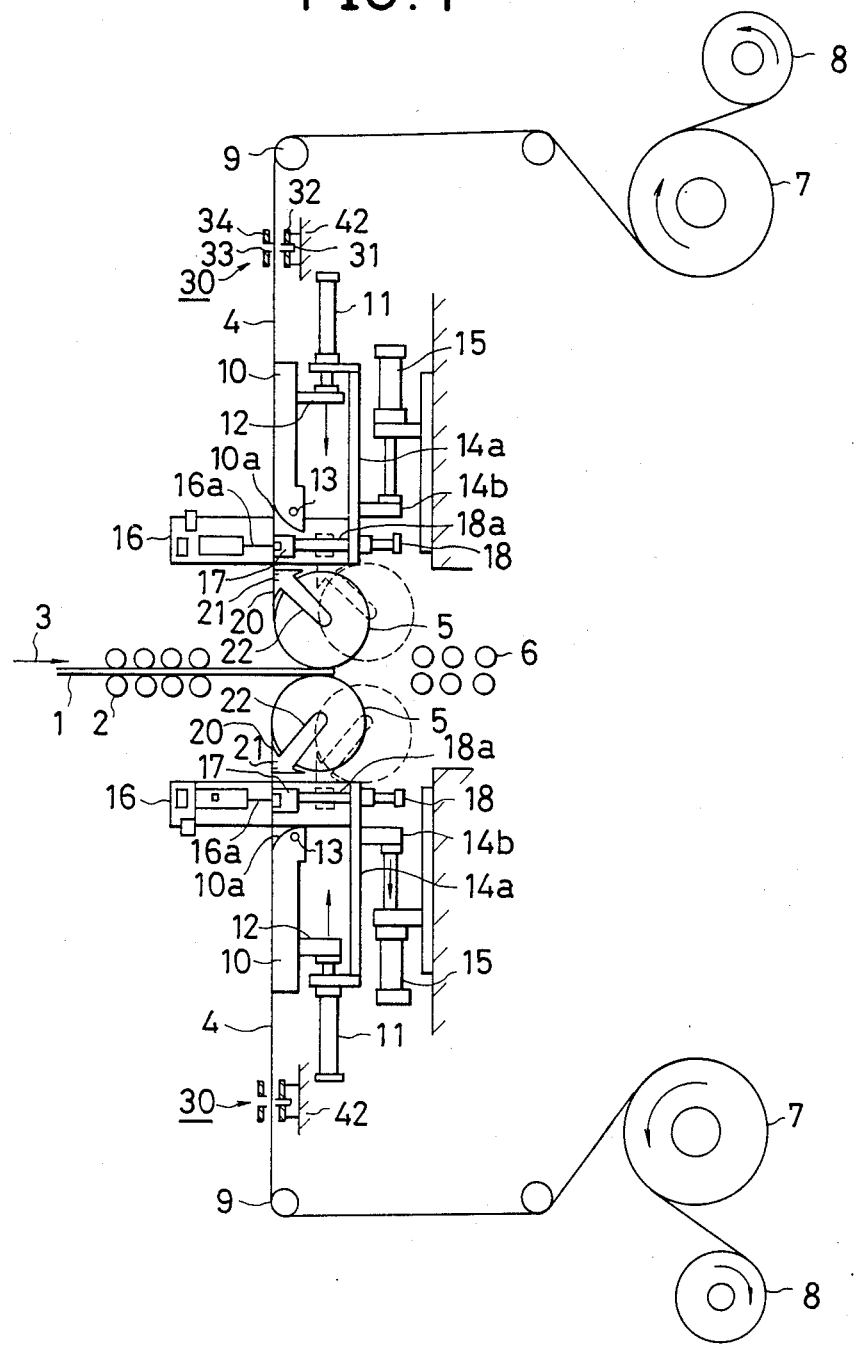
FIG. 1 is a schematic diagrammatical view illustrating an embodiment of a laminater according to the present invention.

FIG. 1 shows a schematic diagrammatical view of the laminater that is an embodiment according to the present invention.

It is constructed such that a substrate 1 having usually a plate thickness of about 1.6 mm is fed by inlet feeding rolls 2 in the direction of the arrow 3 and delivered by delivery rolls 6 while a film (a laminated film) 4, 4 being fed in upward and downward directions of the substrate 1 from both upper and lower sides is bonded thermocompressively by a pair of heat rolls 5, 5 consisting of induction heat jacket rollers. There is no difference between the above construction and the conventional one. Whilst the apparatus is constructed symmetrically at the both upper and lower sides of the substrate 1, the one disposed at the upper side will be described here for brevity of description.

In an apparatus for feeding the film 4, the film 4 formed in a three-layer structure consisting of a photoresist (photosensitive resin) layer as a middle layer, a polyethylene (translucent resin) layer on the surface thereof as a cover film and a polyethylene terephthalate film (translucent resin) layer as a carrier film is wound on a feeding roll 7. In order to remove the polyethylene layer from the film layers of the three-layer construction, the feeding apparatus of the film 4 is provided with a take-up roll 8. In a film feeding passage along which the film 4 of a predetermined length is fed onto the substrate 1 of a predetermined length from the feeding apparatus is provided a free roller 9 designed in the up-and-down direction. Each time the film 4 is fed to a newly supplied substrate 1, the free roller 9 is displaced to a position where a tension is applied in the downward direction to feed to the substrate 1 the film 4 of a length corresponding to the length of the movement.

At a vertical location below of the free roller 9 is provided a main vacuum plate 10 formed integrally with a vacuum chamber for enabling a suction force to be applied to the surface of the plate. The main vacuum plate 10 is connected to move in the up-and-down direction by (a piston rod of) a first air cylinder 11 through a connecting member 12 and constructed to hold the film 4 by suction when the vacuum chamber formed therewithin communicates with a vacuum pump (not shown).

The first air cylinder 11 is connected through connecting members 14a, 14b to a second air cylinder 15. The second air cylinder 15 is in turn connected to a rotary cutter apparatus 16 through the connecting members 14a, 14b, to a second vacuum plate 17 having a suction action on the surface thereof and located under the lower end portion 10a of the main vacuum plate 10 to face a cutter 16a of the rotary cutter apparatus 16, and to a third air cylinder 19 which causes the second vacuum plate 17 to be operated in the horizontal direction through a piston rod 18a. The lower end portion 10a of the main vacuum plate 10 is formed in an arc in a cross section and is provided with a heater 13.

In the neighborhood of the circumferential surface of the heat roll 5 is provided a film suction member 20 which has a length virtually equivalent to the breadth of the heat roll 5 and is of a hollow body having a nearly triangular cross section. It is provided with a number of suction holes 21 on the side surfaces facing the film and is supported by supporting arms 22 mounted in parallel to the both end surfaces of the heat roll 5. The supporting arms 22 are rotated at a velocity equal to or a little bit slower than that of the heat roll 5 after the film 4 has been cut (while the rear end portion of the film remains still stuck) and are provided therein with through-holes (not shown) communicating the hollow chamber of the film suction member 20 with an exterior source of vacuum.

Furthermore, on the film feeding passage, more specifically, at a position above the main vacuum plate 10, a punching device 30 with a cutter supporter 32 having a cutter 31 and a die supporter 34 having a die 33 corresponding to the cutter 31 mounted adjacent to both sides of the film 4 is mounted to a frame 42 constituting the main body in manner to be movable in the up-and-down direction by a driving mechanism.

Figure 4:
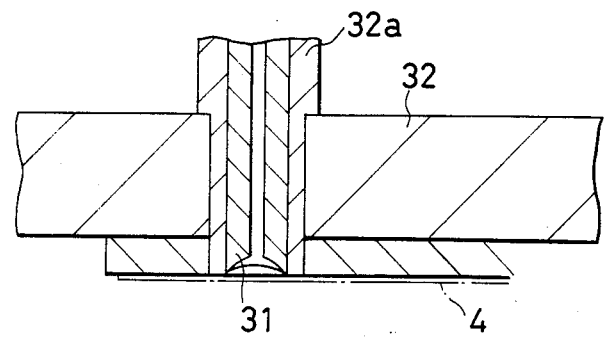
Figure 5:
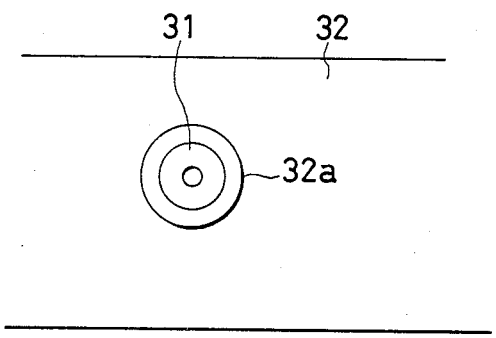

FIGS. 2 to 5 are illustrations of the details of the punching device 30, in which FIG. 2 is a cross-sectional view cut by a plane perpendicular to the film surface, FIG. 3 is a side view in the direction of the line III—III in FIG. 2, FIG. 4 is an enlarged cross-sectional view of the portion A in FIG. 2, and FIG. 5 is an enlarged bottom view of the portion A in FIG. 2. In the drawings, the cutter 31 having a cylindrical cross section is accommodated in a cutter holding member 32a so as to be movable in a back-and-forth direction by compressed air pressure or other appropriate means. The cutter holding member 32a is in turn mounted at predetermined positions (4 positions in the drawings) of the cutter supporter 32.

The cutter supporter 32 is mounted and held at a predetermined distance on a frame member 37 supported on the frame 42 of the main body of the laminater through arms 36, 36 using two supporting bolts 38, 38.

The die supporter 34 equipped with a die 33 through which the cutter 31 passes, is supported by a driving apparatus such as a hydraulic cylinder or the like so as to face the cutter supporter 32 and to move with the two supporting bolts 38, 38 serving as guiding shafts. At one end of the frame member 37, as shown in FIG. 3, a gear apparatus 41 for moving the frame member 37 vertically in an up-and-down direction is arranged in a manner engageable with a screw shaft 40 supported on the laminater body through the arm 36. At the other end of the frame member 37 is mounted a guiding member 44 engageable with a groove portion 43 formed on the arm 36. These mechanisms are utilized for adjustment in selecting punching positions because substrates 1 to be used are in various sizes and, moreover, the punching positions vary with the sizes of films 4 corresponding to the sizes of the substrates. It is to be noted here that chips of the film 4 resulting from the punching of the film 4 are blown off by means of compressed air introduced through the through-hole 32b of the cutter holding member 32a and passing through the inside of the cylindrical cutter 31, and retained in a space under the die 33. The chips retained in the space are then removed by a chips removing apparatus, for instance, by collecting the chips in a chips collection box by means of a suction force, although not shown in the drawings. It may also be possible to manually remove the chips retained in the space. It is also to be noted in the present invention that a photoelectric sensor (not shown) for detecting a length of the substrate 1 may be mounted in the vicinity of the feeding rolls 2 and signals detected thereby are fed to positioning means for each of the punching device and a cutting apparatus, thereby setting the punching and cutting positions of the film automatically in accordance with lengths of the substrates being conveyed.

Thus, the laminater for laminating the film 4 cut to a predetermined length on the substrate 1 having positioning holes (guide holes) can improve work efficiency because the film 4 can be punched at the punching positions in accordance with the positions of the positioning holes of the substrate 1 prior to or during the lamination of the film 4 by mounting the punching device 30 for forming holes (through-holes) in predetermined sizes by punching the film 4 at the positions corresponding to the positioning holes on the substrate 1, at predetermined positions on the film feeding passage which feeds the film to the substrate 1.

By mounting the apparatus for removing the chips of the film 4 resulting from the punching of the film 4 with the punching device 30, it is also to be noted that work efficiency can be improved because holes can be formed by punching the film 4 at the punching positions prior to or during the lamination of the film 4 on the substrate 1 and the chips of the film 4 can be removed at this moment.

The operations in this embodiment are conducted in the following order, with the description applying to the upper portion of the substrate for brevity, it being understood that the identical operations can be applied to the lower portion of the substrate.

(I) The film 4 composed of the three-layer construction wound on the feeding roll 7 is caused, after the polyethylene layer thereof has been wound on the take-up roll 8, to be manually pulled down via the free roller 9 to position the front end of the film 4 at the lower end portion 10a of the main vacuum plate 10 located underneath, that is, at a position of the cutter 16a.

(II) When the substrate 1 is transferred by the inlet feeding rolls 2 to a predetermined position, the inside of the second vacuum plate 17 is caused to communicate with the vacuum pump so that it catches the front end of the film 4 pulled down (the film 4 cut with the cutter 16a when a continuous operation is being run) by the suction force. While carrying the film 4, vacuum plate 17 is retracted by the third air cylinder 18 to thereby allow the front end of the film 4 to be caught on the arcuate surface of the lower end portion 10a of the main vacuum plate 10 where the vacuum suction action is working. At the same time, the free roller 9 releases a length of film sufficient to give a slight margin for a stroke of the main vacuum plate 10.

As the front end portion of the substrate 1 is conveyed to a position nearly directly below the main vacuum plate 10, the rotation of the feeding rolls 2 stops, thereby stopping the substrate 1. Then two pressing members (not shown) press the substrate 1.

(III) By operating the first air cylinder 11, the film 4 stuck on the main vacuum plate 10, in particular, the arcuate surface at the lower end portion 10a thereof, is lowered to the position of the substrate 1 and temporarily bonded thermocompressively on the substrate 1.

(IV) After the front end portion of the film 4 has been temporarily bonded thermocompressively on the substrate 1, the vacuum suction action of the main vacuum plate 10 is stopped temporarily to release the film 4, and then the main vacuum plate 10 is raised by the first air cylinder 11 upwardly from the substrate 1. At the same time, the second air cylinder 15 is operated to move the rotary cutter apparatus 16, the second vacuum plate 17 and the connecting member 14a of the first air cylinder 11 in the upward direction, away from the substrate 1.

(V) At the same time as the main vacuum plate 10 is raised a predetermined distance, the rotating heat roll 5 approaches the substrate 1 and clamps the substrate 1 to which the front end of the film 4 is bonded temporarily by thermocompression. At the same time, the feeding rolls 2 start rotating again, and the film 4 is bonded by thermocompression and then delivered. At this moment, the second vacuum plate 17 stops its vacuum suction action and returns to the original position, in the left direction as shown in the drawing, where it faces the cutter 16a.

(VI) The free roller 9 is returned to the original position in a state in which the film 4 is clamped sufficiently with the heat roll 5 (during this time, the film 4 is continuously laminated on the substrate 1).

(VII) As a particular amount (a particular length) of the film 4 is fed, the second air cylinder 15 is operated and the entire apparatus is lowered toward the substrate 1. At this time, the film 4 is caught by vacuum action of the main vacuum plate 10 and the second vacuum 17, and as the main vacuum plate 10 and the second vacuum plate 17 are lowered by the second air cylinder 15, at a speed faster than the speed for laminating the film 4 on the substrate 1 (equal to the circumferential speed of the heat roll 5). At a particular position (the bottom point), the main vacuum plate 10 and the second vacuum plate 17 are stopped. At this moment, the film 4 is in a loose state between the second vacuum plate 17 and the heat roll 5. During a period of time until that portion of the film 4 in the loose state is fully delivered to the heat roll, a portion of the film located on the cutter apparatus portion is held stationary to permit the film 4 to be cut by moving the rotary cutter 16a in the widthwise direction of the continuous film 4.

The apparatus may be constructed such that, while the cutter 16a is lowered simultaneously with the main vacuum plate 10 and the second vacuum plate 17 at a speed substantially equal to or a little faster than the circumferential speed of the heat roll 5, the film is cut during its downward movement by displacing the rotary cutter 16a in the widthwise direction across the continuous film 4. In this case, the film positioned on the cutter apparatus portion does not move relative to the rotary cutter in the film feeding direction so that the film can be cut in the same manner as the film is stationary, as described above. After the film has been cut, the die supporter 34 of the punching device 30 is moved toward the cutter supporter 32 by the driving apparatus 39. At a distance of about 2 mm, the cutter 31 is inserted into the die 33, thereby punching holes in the film 4. At the same time, air is blown through the hole 32b to remove small pieces and minute chips of the film 4 resulting from the punching thereof.

It is noted here that the size of the hole to be formed on the film by punching is designed to be a little larger than the corresponding positioning hole formed previously by punching the substrate 1.

(VIII) In order to prevent the film 4, cut as described above, from coming down and to ensure a normal compressive bonding action without causing any bubbles and wrinkles when the rear end portion of the cut film 4 is laminated on the substrate 1 by thermocompression bonding, the rear end portion of the cut film 4 is transferred near the substrate 1 along the circumferential surface of the heat roll 5 while it is supported by the suction hole 21 of the film suction member 20, and then the suction is released to effect the thermocompression bonding.

(IX) Thereafter, the clamping action of the heat rolls 5 is released and the pair of heat rolls 5 are separated from each other and returned to the original positions. It is to be noted here that, at this moment, the first and third air cylinders are returned to the position in preparation for the next stage (the position as shown in FIG. 1).

As described above, the film 4 can be punched at the positions coninciding with the positions of the holes previously punched on the substrate 1 and the film 4 can be cut to correspond to the length of the substrate, thereby eliminating adverse effects exerted heretofore upon the punching of holes on the substrate in conventional devices, particularly adverse effects resulting from chips. It is also noted that heating of the film by the heat rolls 5 can be excluded, and work efficiency can be improved because the film 4 can be laminated on the substrate continuously without stoppage.

It is to be understood that, in the embodiment above, an example has been described, in which the cutter supporter 32 is stationary and the die supporter 34 is moved toward the cutter supporter 32; however, the present invention includes the case when the motion of both supporters is reversed. Although the above embodiment describes the structure in which the punching device 30 is moved up-and-down by the driving apparatus in accordance with the size of the substrate, it is to be noted that the apparatus of the present invention can be arranged and operated so that the holes are formed at positions which coincide with the positions where the holes are formed in the substrate. For example, it is possible to allow the punching device to be moved in unison with the first or second transferring apparatus, or to be mounted on a member capable of moving at a speed equal to the film.

It is also possible that the present invention may be constructed to provide a laminater with a punching device which can form holes on the film 4 with laser beams.

I claim:

1. In a laminater for laminating a film onto a substrate and having feed means for feeding a substrate along a substrate feed path, the substrate having positioning holes to assist in aligning the film thereon, film feeding means for feeding the film from a continuous web along a film feed path, bonding means to bond the film onto a surface of the substrate, film handling means for tacking a leading edge portion of the film onto a leading edge portion of the substrate and for maintaining the position of the film relative to the substrate surface to prevent wrinkling of the film during bonding, cutting means positioned along the film feed path for cutting the film to a length corresponding to the length of the substrate during bonding, and means to remove the laminated substrate from the bonding means, the improvement comprising:

a punching device provided at a predetermined position on the film feed path to form alignment holes in said film;

removal means operatively associated with the punching device to remove from the film chips formed by the punching of the film and to collect said chips, said removal means including means for directing a gaseous fluid against the formed chips; and control means to control operation of said punching device to form the alignment holes in said film at positions which correspond to the positioning holes on said substrate when said film has been laminated on said substrate, said control means including sensor means positioned along said substrate feed path to detect the positioning holes in said substrate and operating means to operate said punching device in response to said sensor means.

2. A laminater as set forth in claim 1, wherein said control means further comprises means for moving said punching device along said film feed path.

3. A laminater as set forth in claim 1, wherein said punching device comprises a pair of cutters, each coacting with a respective die to form said alignment holes in said film, said cutter having flow control means for directing the gaseous fluid against the formed chips.

4. A laminater as set forth in claim 3, wherein each of said cutters is provided with a flow passage for the gaseous fluid.

5. A laminater as set forth in claim 3, wherein said cutters are adjustably positioned on a cutter support disposed adjacent to one surface of said film, and said dies are adjustably positioned on a die support disposed adjacent to the other surface of said film.

* * * * *